United States Patent [19]

Webster

[11] 4,413,766
[45] Nov. 8, 1983

[54] METHOD OF FORMING A CONDUCTOR PATTERN INCLUDING FINE CONDUCTOR RUNS ON A CERAMIC SUBSTRATE

[75] Inventor: Harold F. Webster, Schenectady, N.Y.

[73] Assignee: General Electric Company, Schenectady, N.Y.

[21] Appl. No.: 250,992

[22] Filed: Apr. 3, 1981

[51] Int. Cl.³ .............................................. H05K 3/06
[52] U.S. Cl. .................................... 228/123; 29/847; 228/159; 228/198
[58] Field of Search ............... 228/122, 123, 124, 165, 228/188, 198, 159; 29/846, 847; 428/471, 163, 167

[56] References Cited

U.S. PATENT DOCUMENTS 3,766,634 10/1973 Babcock et al. .................. 29/471.9
3,993,411 11/1976 Babcock et al. ..................... 228/903
3,994,430 11/1976 Cusano et al. ...................... 228/122
4,190,474 2/1980 Berdan et al. .......................... 29/847

FOREIGN PATENT DOCUMENTS 1127179 4/1962 Fed. Rep. of Germany ...... 228/165

OTHER PUBLICATIONS

Sun et al., Published Article in *IEEE Transactions on Electron Devices*, vol. ED-23, No. 8, Aug. 1976, pp. 961-967.

*Primary Examiner*—Kenneth J. Ramsey
*Attorney, Agent, or Firm*—Charles E. Bruzga; James C. Davis, Jr.; Marvin Snyder

[57] ABSTRACT

Methods of forming a conductor pattern including fine conductor runs direct bonded, using an eutectic composition, to a ceramic substrate are disclosed. These methods provide grooves in the side of a metallic sheet to be bonded to the ceramic substrate, the grooves serving as vent passages for any otherwise entrapped gas between the metallic sheet and the ceramic substrate.

17 Claims, 19 Drawing Figures

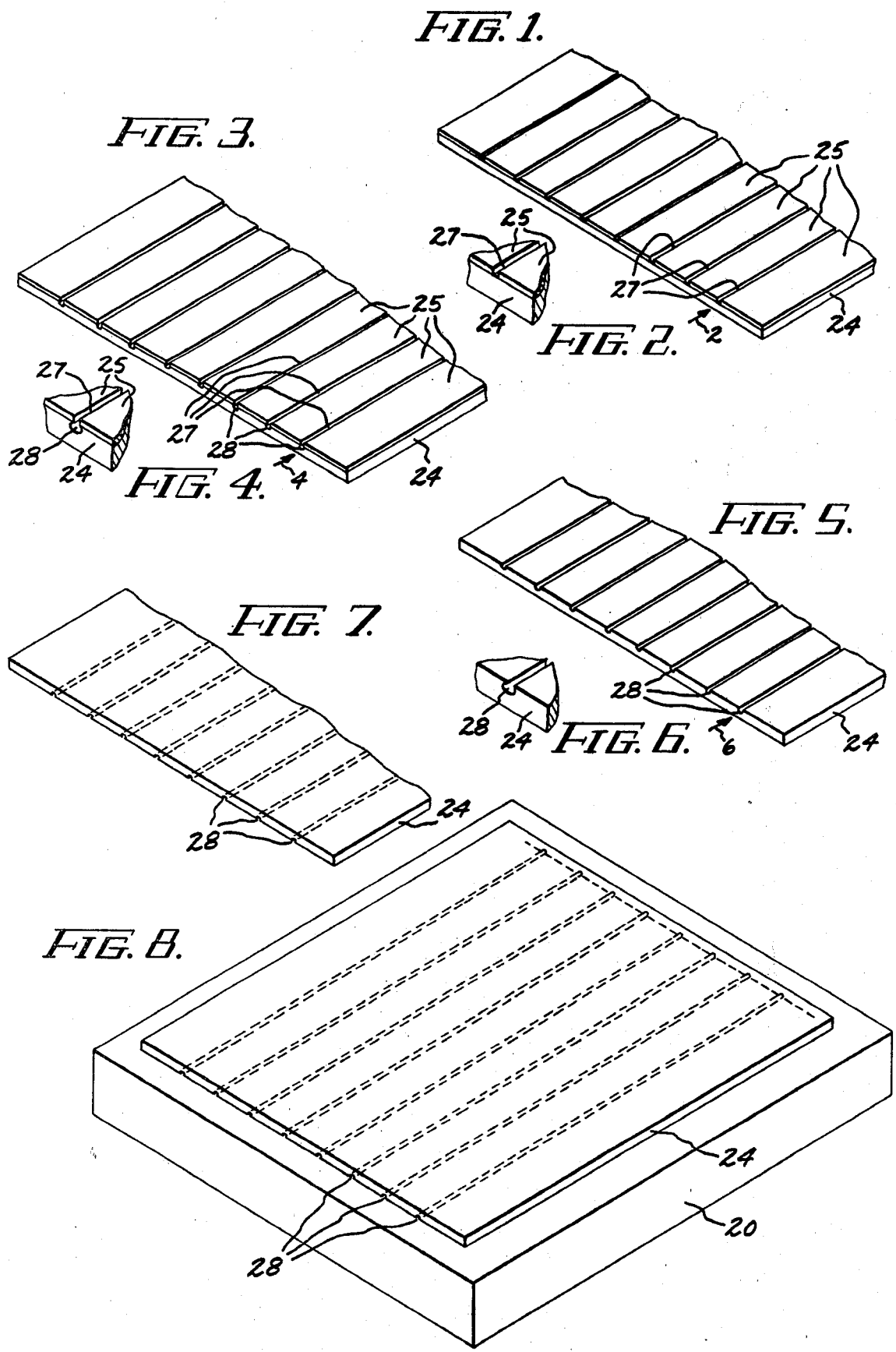

METHOD OF FORMING A CONDUCTOR PATTERN INCLUDING FINE CONDUCTOR RUNS ON A CERAMIC SUBSTRATE

BACKGROUND OF THE INVENTION

The present invention relates to a method of forming a conductor pattern including fine conductor runs on a ceramic substrate, and more particularly to such a method wherein the conductor pattern becomes direct bonded using a eutectic composition to the ceramic substrate.

The technique of direct bonding using a eutectic composition has been used to bond metal such as copper to a ceramic substrate, as discussed, for example, in the following U.S. Pat. No. 3,766,634—G. L. Babcock et al. and U.S. Pat. No. 3,994,430—D. A. Cusano et al., which are both assigned to the same assignee as the present invention and which are incorporated herein by reference. The foregoing bonding technique is also referred to as "direct bonding" in the specification.

A problem has arisen where a metallic sheet or foil such as a copper sheet has been direct bonded to a ceramic substrate. The problem is that gas has been trapped between the copper sheet and the ceramic during the process of direct bonding and caused the metallic sheet to form bubbles or pockets containing the gas. The origin of such gas is not completely understood but it is likely due to entrapment of furnace gas between the metallic sheet and the ceramic during the bonding process, or by emanation of gases from the metallic sheet or from contaminants during the direct bonding process.

One prior approach to overcoming the problem of bubbles occurring in a metallic sheet direct bonded to a ceramic substrate has been to provide an array of circular holes through the metallic sheet. Otherwise trapped gas can evacuate through the holes. This approach, however, is not satisfactory for a metallic sheet which is to be formed into a conductor pattern including fine conductor runs due to the fact that the holes may exist where a fine conductor run is desired.

OBJECTS OF THE INVENTION

Accordingly, it is an object of the present invention to provide a method of forming a conductor pattern including fine conductor runs direct bonded to a ceramic substrate, which method is not subject to the problem of bubbles forming in the conductor pattern due to trapped gas between the conductor and the ceramic substrate.

Further objects and advantages of the present invention will become apparent from a reading of the remainder of this specification in conjunction with the drawing figures.

SUMMARY OF THE INVENTION

In carrying out the present invention in one form, there is provided a method of forming a conductor pattern including fine conductor runs on a ceramic substrate. The method comprises forming a plurality of grooves in a first side of a metallic sheet, the grooves not crossing portions of the metallic sheet which are to be formed into the fine conductor runs. The first side of the metallic sheet is direct bonded using a eutectic composition onto the ceramic substrate. During this bonding process, the grooves serve as vent passages for otherwise entrapped gas between the metallic sheet and the ceramic substrate. After completing the bonding process, metal is selectively removed from the metallic sheet to form the conductor pattern.

In carrying out the present invention in another form, there is provided a further method of forming a conductor pattern including fine conductor runs on a ceramic substrate. The further method comprises selectively removing metal from a first side of a metallic sheet to define an outline of the conductor pattern. The first side of the metallic sheet is direct bonded using a eutectic composition onto the ceramic substrate. During the bonding process, the metal selectively removed from the first side of the metallic sheet provides vent passages for otherwise trapped gas between the metallic sheet and the ceramic substrate. After the bonding procedure is completed, metal is selectively removed form a second side of the metallic sheet to form the conductor pattern.

BRIEF DESCRIPTION OF THE DRAWING FIGURES

FIG. 1 is a perspective view of a portion of a metallic sheet having a photoresist pattern thereon;

FIG. 2 is a fragmentary detail of FIG. 1 taken at an arrow 2 thereof;

FIG. 3 is a perspective view similar to FIG. 1 showing the metallic sheet with etched grooves therein;

FIG. 4 is a fragmentary detail of FIG. 3 taken at an arrow 4 thereof;

FIG. 5 is a view similar to FIG. 4 after the photoresist is removed;

FIG. 6 is a fragmentary detail of FIG. 5 taken at an arrow 6 thereof;

FIG. 7 is a view similar to FIG. 5 with the metallic sheet turned upside down;

FIG. 8 is a perspective view of the metallic sheet of FIG. 7 disposed on a ceramic substrate;

DETAILED DESCRIPTION

Figure 10:
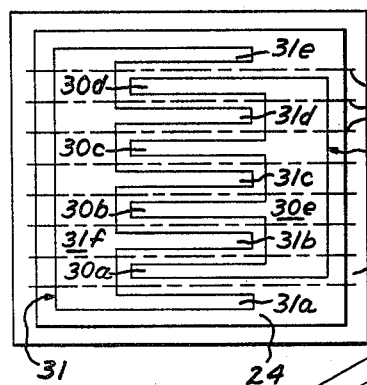
FIG. 10 is a top plan view of the structure of FIG. 9 illustrating the location of the etched grooves in the metallic sheet relative to the photoresist pattern.

The present invention is directed to methods for forming conductor patterns including fine conductor runs direct bonded to a ceramic substrate. Such a conductor pattern is illustrated in FIG. 12. The conductor pattern comprises interdigitated electrodes 21 and 22 having "digits" or fine conductor runs 21a-21d and 22a-22e, respectively. By way of example, these fine conductor runs can have width and thickness dimensions of 6 mils and 3 mils, respectively. The conductor pattern is direct bonded to a ceramic substrate 20 such as alumina or beryllia, such bonding procedure discussed in detail in the above-cited patents. The inventive method of forming the conductor pattern on the substrate 20 is discussed as follows with reference to FIGS. 1-11.

Turning to FIG. 1, there is shown a metallic sheet 24 which may comprise, for example, copper. The thickness of the sheet 24 is the same as that of the final conductor pattern (FIG. 12). The metallic sheet 24 has disposed thereon a photoresist pattern having channels 27 which serve to selectively expose portions of the metallis sheet 24. The photoresist pattern 25 protects the portions of the metallic sheet 24 that it covers from etching by a wet chemical etchant, used as discussed below. The photoresist pattern 25 comprises a photoresist material such as Laminar ® dry film photopolymer sold by Dynachem Corp. of Santa Anna, Calif. The details of FIG. 1 are better illustrated in the fragmentary view of FIG. 2, taken at an arrow 2 in FIG. 1. The upper surface of the structure of FIG. 1 is subjected to a wet chemical etchant such as ferric chloride whereby the portions of the metallic sheet 24 exposed by the channels 27 become etched to form a plurality of grooves 28, as illustrated in FIG. 3. The foregoing details are better illustrated in FIG. 4 showing a fragmentary view of FIG. 3 taken at an arrow 4 in FIG. 3. In accordance with the present invention, the plurality of grooves 28 provide vent passages for any trapped gas between the metallic sheet 24 and a ceramic substrate 20 (FIG. 8), whereby the formation of bubbles in the metallic sheet 24 is prevented. FIG. 5 shows the metallic sheet 24 of FIG. 3 after the photoresist pattern 25 has been removed with a photoresist stripper such as that sold by the Inland Chemical Corporation of Oneida, N.Y., under the code AP-612. FIG. 6 amplifies the details of FIG. 5 and is taken at arrow 6 in FIG. 5. By way of example, the plurality of grooves 28 suitably have the following dimensions where the metallic sheet 24 comprises copper with a thickness of 3 mils: widths—1.0 mil; heights—1.0 mil; and spacing from each groove to the center of each of the two adjacent fine conductor runs—6.5 mils.

Turning to FIG. 7, there is shown the metallic sheet 24 of FIG. 5 turned upside down, whereby the plurality of grooves 28 face downward. The full metallic sheet 24 is shown in FIG. 8 disposed on a ceramic substrate 20, the plurality of grooves 28 facing an upper surface of the substrate 20. The metallic sheet 24 is direct bonded using a eutectic composition to the substrate 20 at an elevated temperature. Specific details on this bonding technique are discussed in the above-cited patents.

Figure 9:
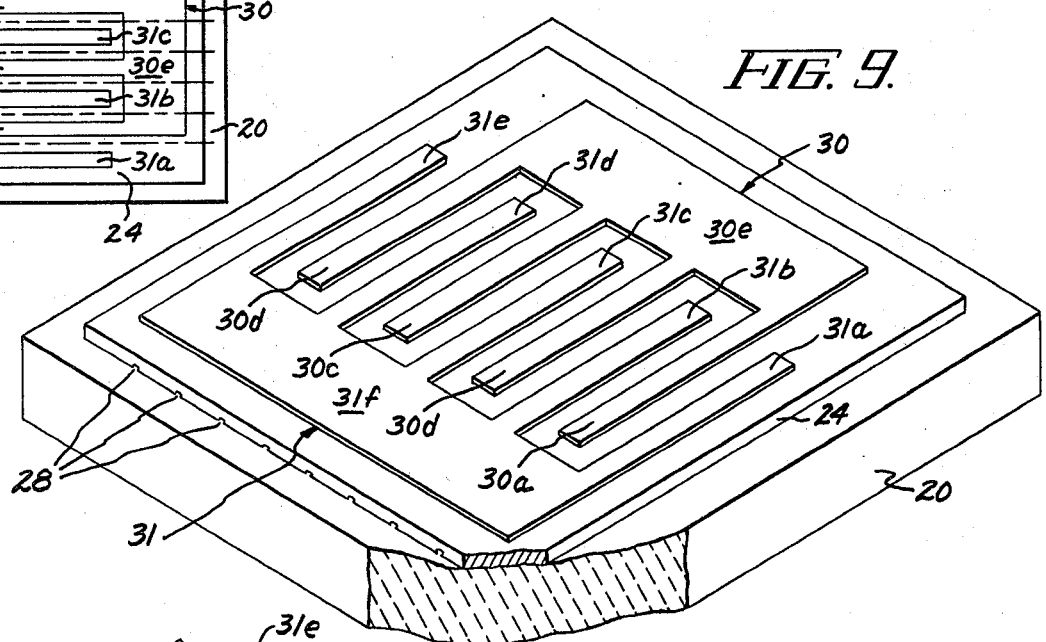
FIG. 9 is a view similar to FIG. 8 after a further photoresist pattern has been disposed on the upper surface of the metallic sheet.

Turning to FIG. 9, the structure of FIG. 8 is shown after photoresist patterns 30 and 31 have been disposed on the upper surface of the metallic sheet 24. The photoresist patterns 30 and 31 suitably comprise a photoresist material such as that referenced above with respect to the photoresist pattern 25. The photoresist patterns 30 and 31 comprise "digit" portions 30a-30d and 31a-31e, respectively, and large areas 30e and 31f of the metallic sheet 24 to which the photoresist digits portions 30a-30d and 31a-31e are connected, respectively. These photoresist digit portions correspond with the fine conductor runs 21a-21d and 22a-22e, respectively, which are shown in FIG. 12.

The relationship between the plurality of grooves 28 and the photoresist digit portions 30a-30d and 31a-31e are better illustrated in FIG. 10, which is a top plan view of the structure of FIG. 9. In FIG. 10, the plurality of grooves 28 are represented by broken lines 28'. In accordance with the present invention, the lines 28' do not cross any portions of the metallic sheet 24 which are to be formed into the fine conductor runs 21a-21d and 22a-22e, shown in FIG. 12. The lines 38' do, however, cross the large areas 30e and 31f of the metallic sheet 24. The significance of the foregoing constraint on the lines 28' of not crossing portions of the metallic sheet 24 which are to be formed into fine conductor runs is due to the fact that the metallic sheet 24 of FIG. 9 with the photoresist patterns 30 and 31 thereon is subjected to a wet chemical etchant such as ferric chloride. The wet chemical etchant etches the exposed portions of the metallic sheet 24. Owing to the fact that the plurality of grooves 28 (as represented by the lines 28') do not cross or pass beneath any portions of the metallic sheet 24 which are formed into fine condcutor runs, the integrity of these fine conductor runs during this wet chemical etching process is assured. If, on the other hand, one of the plurality of grooves 28 crossed or passed beneath a portion of the metallic sheet 24 which is formed into a fine conductor run and such groove had a length below about 20 mils, then the wet chemical etchant applied to the structure of FIG. 9 would be able to readily penetrate such groove and etch the metal of the fine conductor run above the groove. Such etching poses a serious risk of completely etching away the fine conductor run at the location of the groove crossing the fine conductor run.

The large areas 30e and 31f of the metallic sheet 24 have minimum widths of about 20 mils, and preferably have widths of about 50 mils. Accordingly, the fact that the plurality of grooves 28 crosses or passes beneath the large areas 30e and 30f presents a different situation than where one of the plurality of grooves 28 crosses beneath a fine conductor run having a width less than about 20 mils. This is because a wet chemical etchant which is applied to the structure of FIG. 9 cannot readily penetrate throughout the lengths of the plurality of grooves 28 crossing beneath the large areas 30e and 31f which exceed about 20 mils. Due to this fact, there is not posed a serious risk of such wet chemical etchant etching away, to an intolerable degree, the portions of the large areas 30e and 31f above the plurality of grooves 28.

Figure 11:
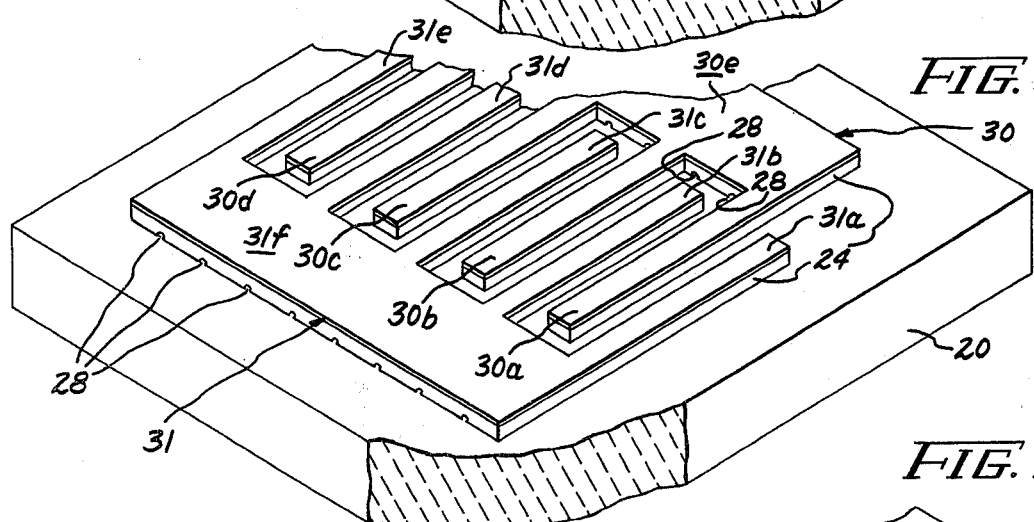
FIG. 11 is a view of the structure of FIG. 9 after the metallic sheet thereof has been subjected to a wet chemical etchant.
Figure 12:
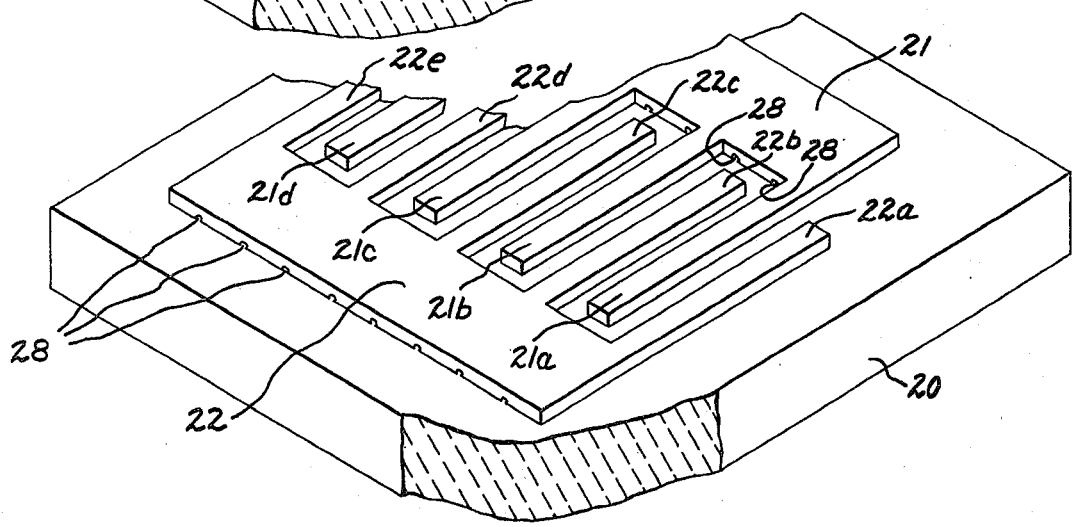
FIG. 12 shows the structure of FIG. 11 after the photoresist has been removed.

After the photoresist patterns 30 and 31 are removed from the metallic sheet 24 of FIG. 11 with a photoresist stripper (such as that referenced above with respect to the photoresist pattern 25), the method of the present invention provides the final conductor pattern comprising the interdigitated electrodes 21 and 22, as shown in FIG. 12.

The fine conductor runs 21a-21d and 22a-22e shown in FIG. 12 may have width and thickness dimensions different from 6 mils and 3 mils as mentioned above. For fine conductor runs formed with a wet chemical etching process as discussed above, preferred width dimensions are in the range from about 6 to 60 mils, and preferred thickness dimensions are in the range from about 3 to 10 mils, with the ratio of width to thickness preferably exceeding about 2 to 1. Where the metallic sheet 24 (FIGS. 1-11) comprises copper with a preferred thickness dimension of between about 3 mils and 10 mils, preferred dimensions of the plurality of grooves 28 are as follows: widths—about 0.5 to 1.5 mils; heights—about 0.5 to 1.5 mils; and spacing from each groove to the center of each of the two adjacent fine conductor runs—about 3 to 30 mils. For a fine conductor run exceeding about 60 mils in width, a groove should be provided under the fine conductor run and not crossing or passing beneath the fine conductor run. Such groove should be positioned within about 60 mils of the adjacent grooves on either side thereof.

The present invention is directed to a further inventive method for forming a conductor pattern including fine conductor runs direct bonded to a ceramic substrate. Such a conductor pattern is shown in FIG. 19 and comprises interdigitated electrodes 41 and 42 direct bonded to a ceramic substrate 40, such as alumina or beryllia. The electrodes 41 and 42 have "digit" portions or fine conductor runs 41a-41d and 42a-42e, respectively, By way of example, these fine conductor runs can have width and thickness dimensions of 6 mils and 3 mils, respectively. The structure of FIG. 19 is similar to the structure of FIG. 12 except that a plurality of grooves corresponding to the plurality of grooves 28 in FIG. 12 is not provided in the structure of FIG. 19. The inventive method for forming the conductor pattern on the ceramic substrate 40 is described as follows with reference to FIGS. 13-19.

Figure 13:
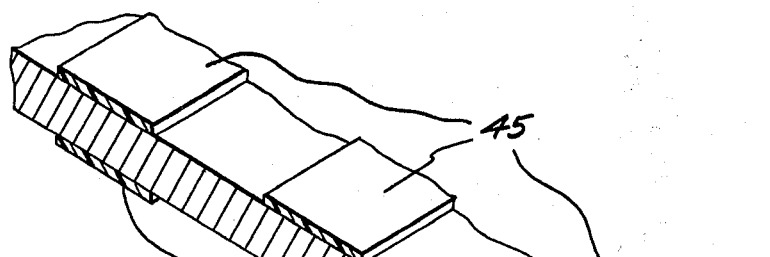
FIG. 13 is a cross-sectional view of a portion of a metallic sheet having photoresist on upper and lower surfaces thereof, in accordance with a further method of the present invention.
Figure 14:
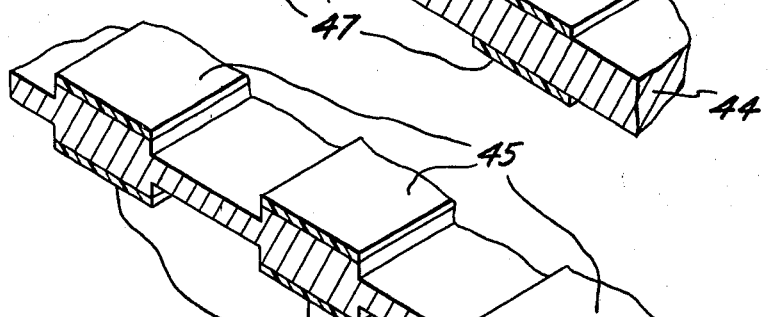
FIG. 14 shows the structure of FIG. 13 after it has been subjected to a wet chemical etchant.
Figure 15:
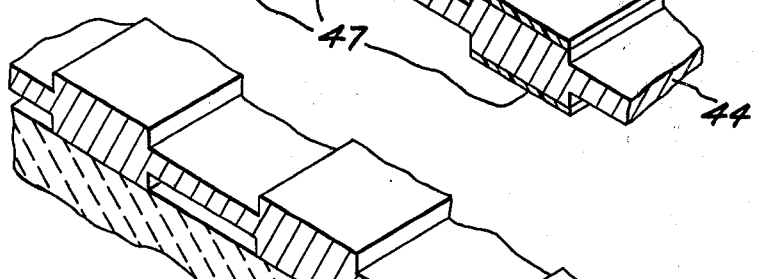
FIG. 15 shows the metallic sheet of FIG. 14 after the photoresist has been removed and the metallic sheet has been disposed on the ceramic substrate.
Figure 16:
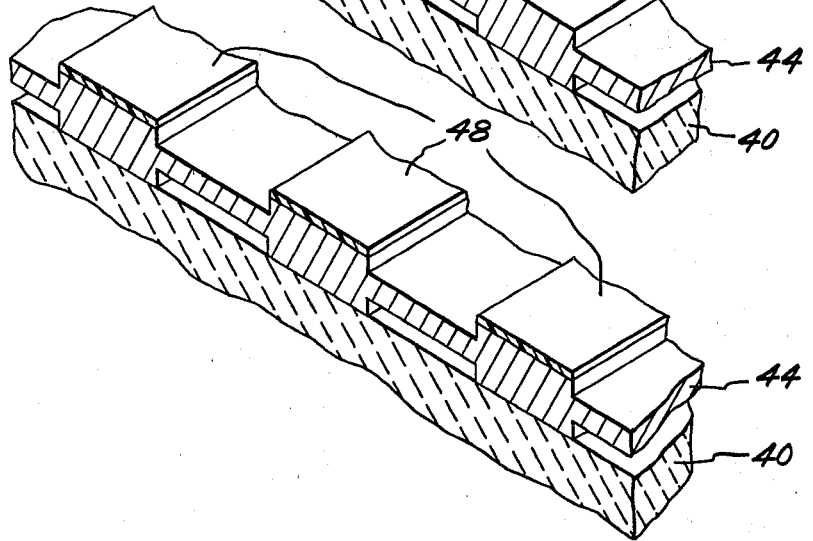
FIG. 16 shows the structure of FIG. 15 after further photoresist has been applied to the upper surface of the metallic sheet.

Turning to FIG. 13, a portion of a metallic sheet 44 is shown with photoresist patterns 45 and 47 on the upper and lower surfaces thereof, respectively. The photoresist patterns 45 and 47 comprise a photoresist material such as that referenced above with respect to the pohotoresist pattern 25. The portions of the metallic sheet 44 between adjacent portions of the photoresist patterns 45 and 47 eventually comprise the fine conductor runs 42a, 41a and 42b, shown in FIG. 19. The upper and lower surfaces of the structure of FIG. 13 are subjected to a wet chemical etchant such as ferric chloride which etches from about one-quarter to one-third of the way through each side of the exposed metallic sheet 44, or, in other words, from about one-half to two-thirds of the way through the metallic sheet 44. The resulting structure is shown in FIG. 14. The photoresist patterns 45 and 45 on the metallic sheet 44 are removed with a photoresist stripper such as that referenced above with respect to the photoresist pattern 25. Thereafter, the metallic sheet 44 is direct bonded using a eutectic composition to a ceramic substrate 40, such as alumina or beryllia. (Details of the technique of direct bonding using a eutectic composition are discussed in the above-cited patents.) The resulting structure appears in FIG. 15. A further photoresist pattern 48 is disposed on the metallic sheet 44, as shown in FIG. 16 and comprises a photoresist material such as that referenced above with respect to the photoresist pattern 25. The upper surface of the metallic sheet 44 of FIG. 16 is then subjected to a wet chemical etchant such as ferric chloride which etches through the exposed portions of the sheet 44, thereby producing the structure of FIG. 17. The metallic sheet 44 at this point has been etched completely through to form the fine conductor runs 42a, 41a and 42b.

Figure 18:
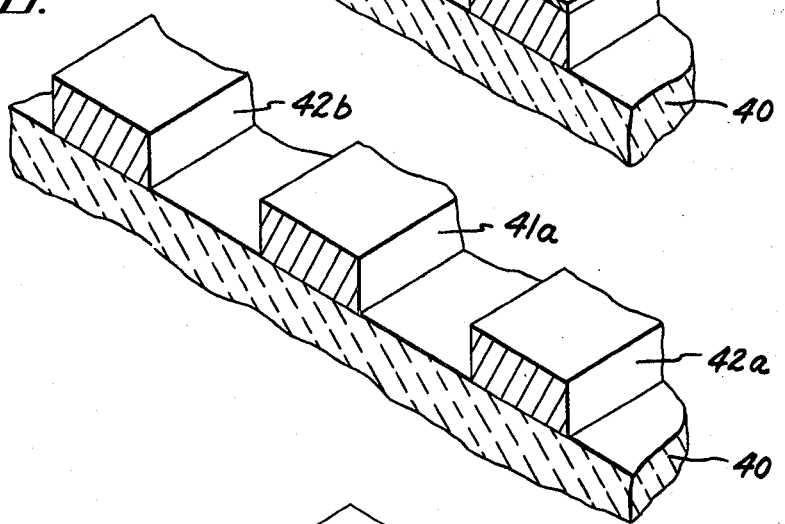
FIG. 18 shows the structure of FIG. 19 after the photoresist has been removed and represents a cross-sectional view taken at arrows 18 in FIG. 19.
Figure 19:
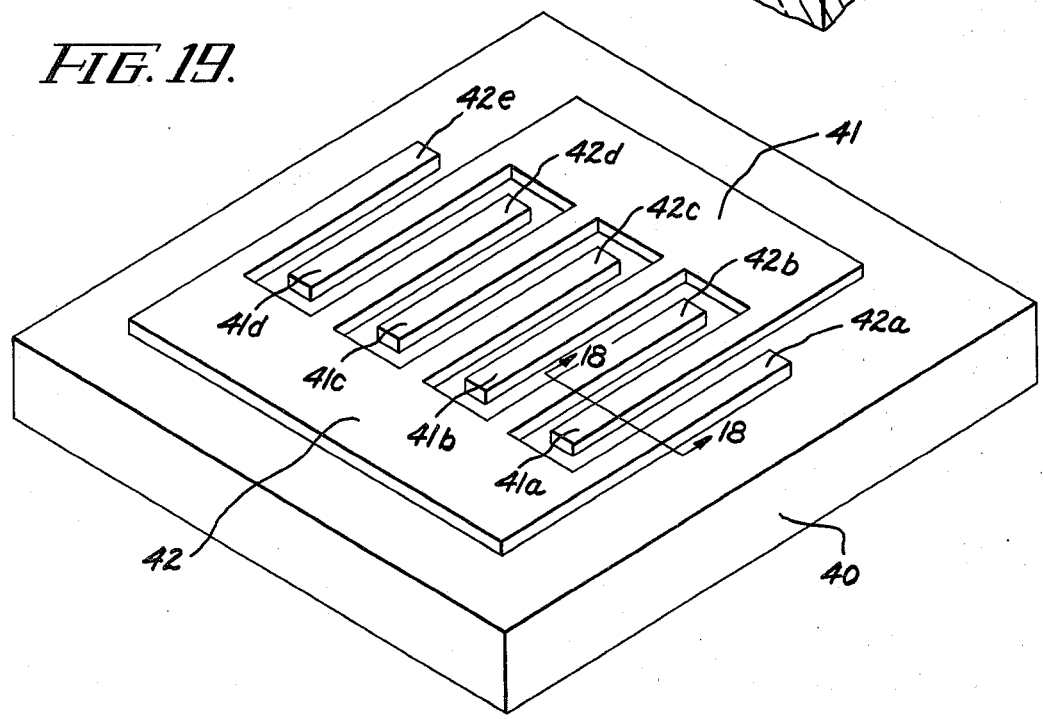
FIG. 19 shows a conductor pattern including fine conductor runs on a ceramic substrate.

With the photoresist pattern 48 removed from the conductor runs 42a, 41a and 42b with a photoresist stripper (such as that referenced above with respect to the photoresist pattern 25), the foregoing, inventive method provides the structure of FIG. 18. FIG. 18 represents a cross-sectional view of the conductor pattern including fine conductor runs of FIG. 19 taken at the arrows of FIG. 19.

The fine conductor runs 41a-41d and 42a-42e shown in FIG. 19 may have width and thickness dimensions different from 6 mils and 3 mils as mentioned above. For fine conductor runs formed with a wet chemical etching process as discussed above, preferred width dimensions are in the range from about 6 to 60 mils, and preferred thickness dimensions are in the range from about 3 mils to 10 mils, with the ratio of width to thickness preferably exceeding about 2 to 1.

Figure 17:
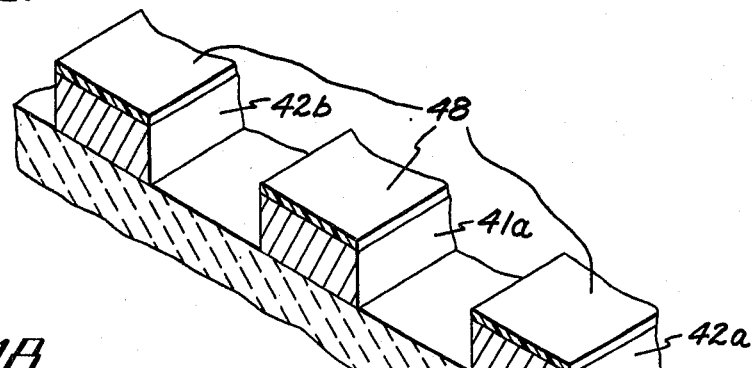
FIG. 17 shows the structure of FIG. 16 after it has been subjected to a wet chemical etchant.

The foregoing, inventive method for forming the conductor pattern comprising the interdigitated electrodes 41 and 42 on the substrate 40 of FIG. 19 attains various advantages, as follows. First, with the metallic sheet 44 of FIG. 14 partially etched away on the lower surface thereof as shown, the problem of gas entrapment between the metallic sheet 44 and the ceramic substrate 40 (FIG. 19) is avoided. This is due to the fact that the lower, etched away portions of the metallic sheet 44 comprise "grooves" which correspond with, or define, an outline of the conductor pattern of FIG. 19. As such, these grooves provide vent passages for any otherwise entrapped gas. Second, with the upper surface of the metallic sheet 44 partially etched away as shown in FIG. 15 and thereby corresponding with, or defining, an outline of the conductor pattern of FIG. 19, the steps of the method for forming such conductor pattern, which are illustrated in FIGS. 15-17, are greatly facilitated. This is explained as follows. The provision of the photoresist pattern 48 is accomplished with the aid of a "mask". Such mask is used to determine which areas of the metallic sheet 44 are to end up having the photoresist pattern 48 thereon. The foregoing mask is easily aligned in proper registration with the metallic sheet 44 of FIG. 15 owing to the fact that the mask has the same pattern as the etched pattern on the upper surface of the sheet 44. Third, a drawback encountered when etching through the metallic sheet 44 of FIG. 13 solely from the upper surface thereof, all the way through the lower surface, is avoided. This drawback is due to the nature of the technique of wet chemical etching. If a wet chemical etchant were applied solely to the upper surface of the metallic sheet 44 of FIG. 13, and were allowed to vertically penetrate completely through the sheet 44, the metal of the metallic sheet 44 under each of the digits of the photoresist pattern 45 would wind up having diminishing cross sections towards the lower surface of the sheet 44. The thicker the sheet 44 is for a given width of the photoresist digits, the more serious this problem is. In an extreme case, the cross sections of the metal of sheet 44 under the digits of the photoresist pattern 45, would completely diminish before reaching the lower surface of the sheet 44, thereby resulting in seriously malformed fine conductor runs. The present inventive method avoids the foregoing drawback by "pre-etching" the lower surface of the metallic sheet 44. As a result of such pre-etching, the further steps of etching the upper surface of the metallic sheet 44 involve significantly less vertical penetration by the wet chemical etchant from the upper surface of the sheet 44, than in the foregoing situation which does not involve pre-etch of the lower surface of the sheet 44. As a consequence of this fact, the resulting cross sections of the fine conductor runs are more nearly rectangular as is desired.

In carrying out the inventive methods described herein, the following phenomenon should be taken into account. During the process of direct bonding a metallic sheet onto a ceramic substrate, the metallic sheet will undergo a thermal expansion cycle which differs from that of the ceramic substrate. For example, where the metallic sheet comprises copper and the ceramic substrate comprises beryllia, the high temperature encountered during direct bonding will cause the copper sheet to expand more than the beryllia substrate when heated to such temperature. After the copper bonds to the beryllia substrate, both the copper and the beryllia substrate tend to contract back to their room temperature dimensions. However, with a sheet of copper which is thin relative to the beryllia substrate, the contraction of the beryllia substrate dominates due to its greater thickness and strength. Consequently, a final copper conductor pattern direct bonded to a beryllia ceramic substrate will be larger than the original copper conductor pattern prior to bonding to the substrate. In order to deal with the present phenomenon, the expansion of an original conductor pattern to a final conductor pattern must be taken into account.

While the invention has been described with respect to specific embodiments, modifications thereof will occur to persons skilled in the art. For example, the grooves of the first inventive method described above could be formed by means other than web chemical etching. By way of example, the grooves could be machined into the bottom of the metallic sheet or embossed into the bottom of the metallic sheet. Such machining could be suitably accomplished with mechanical milling means. With respect to the second inventive method described above, selected portions of the metallic sheet could be removed by means other than wet chemical etching. For example, the lower surface of a metallic sheet could be machined to remove undesired metal. Such machining could suitably be accomplished with mechanical milling means or with a laser machining process. These and all such modifications are deemed to fall within the true spirit and scope of the invention as defined in the appended claims.

What is claimed as my invention and desired to be secured by Letters Patent of the United States is:

1. A method of forming a conductor pattern including fine conductor runs on a ceramic substrate, comprising:
   (a) forming a plurality of grooves in a first side of a metallic sheet, said grooves not crossing portions of said metallic sheet which are to be formed into said fine conductor runs;
   (b) direct bonding using an eutectic composition said first side of said metallic sheet onto said ceramic substrate; and
   (c) selectively removing metal from a second side of said metallic sheet to form said conductor pattern.

2. The method of claim 1 wherein said conductor pattern defines a pair of interdigitated electrodes, the digits of said electrodes being substantially straight and parallel to each other, and wherein said grooves comprise substantially parallel, substantially straight grooves.

3. The method of claim 1 or 2 wherein said forming a plurality of grooves comprises wet chemical etching.

4. The method of claim 3 wherein said selectively removing metal from a second side of said metallic sheet comprises wet chemical etching.

5. The method of claim 1 wherein each of said fine conductor runs have widths between about 6 and 60 mils and thicknesses between about 3 and 10 mils.

6. The method of claim 5 wherein said metallic sheet comprises copper.

7. The method of claim 1, 2 or 5 wherein each of said plurality of grooves is spaced between about 3 and 30 mils from the center of each adjacent fine conductor run.

8. The method of claim 1 wherein said ceramic substrate comprises one of the group consisting of alumina and beryllia.

9. A method of forming a conductor pattern including fine conductor runs on a ceramic substrate, comprising:
   (a) selectively removing metal from a first side of a metallic sheet to define an outline of said conductor pattern;
   (b) direct bonding using a eutectic composition said first side of said metallic sheet onto said ceramic substrate; and
   (c) selectively removing metal from a second side of said metallic sheet to form said conductor pattern.

10. The method of claim 9 wherein said selectively removing metal from said first side of said metallic sheet comprises removing approximately one-quarter to one-third of the thickness of said metallic sheet.

11. The method of claim 9 or 10 further comprising prior to said direct bonding selectively removing metal from a second side of said metallic sheet to define an outline of said conductor pattern.

12. The method of claim 11 wherein said selectively removing metal from said second side of said metallic sheet to define an outline of said conductor pattern comprises removing approximately one-quarter to one-third of the thickness of said metallic sheet.

13. The method of claim 11 wherein:
   (a) said selectively removing metal from said first side of said metallic sheet comprises wet chemical etching;
   (b) said selectively removing metal from said second side of said metallic sheet to define an outline of said conductor pattern comprises wet chemical etching; and
   (c) said selectively removing metal from said second side of said metallic sheet to form said conductor pattern comprises wet chemical etching.

14. The method of claim 11 wherein said metallic sheet comprises copper.

15. The method of claim 14 wherein said fine conductor runs have widths between about 5 and 60 mils and thicknesses between about 3 and 10 mils.

16. The method of claim 9 wherein said ceramic substrate comprises one of the group consisting of alumina and beryllia.

17. The method of claim 9 wherein said selectively removing metal from said first side of said metallic sheet comprises wet chemical etching.

* * * * *